(12) United States Patent
Kunisato et al.

(10) Patent No.: US 6,759,139 B2
(45) Date of Patent: *Jul. 6, 2004

(54) NITRIDE-BASED SEMICONDUCTOR ELEMENT AND METHOD OF FORMING NITRIDE-BASED SEMICONDUCTOR

(75) Inventors: Tatsuya Kunisato, Takatsuki (JP); Nobuhiko Hayashi, Osaka (JP); Hiroki Ohbo, Hirakata (JP); Masayuki Hata, Kadoma (JP); Tsutomu Yamaguchi, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/081,842

(22) Filed: Feb. 25, 2002

(65) Prior Publication Data

US 2002/0127856 A1 Sep. 12, 2002

(30) Foreign Application Priority Data

Feb. 27, 2001 (JP) ........................................ 2001-052351

(51) Int. Cl.$^7$ .............................. H01L 29/12; B32B 9/00
(52) U.S. Cl. ..................... 428/620; 428/698; 257/85; 257/103; 257/631; 438/604
(58) Field of Search .............................. 428/698, 620, 428/627; 257/85, 103, 631; 438/604

(56) References Cited

U.S. PATENT DOCUMENTS

| | | | |
|---|---|---|---|
| 6,015,979 A | 1/2000 | Sugiura et al. | 257/86 |
| 6,051,849 A | 4/2000 | Davis et al. | 257/76 |
| 6,577,006 B1 * | 6/2003 | Oota et al. | 257/745 |
| 2002/0038870 A1 * | 4/2002 | Kunisato et al. | 257/85 |

FOREIGN PATENT DOCUMENTS

| | | |
|---|---|---|
| JP | 10-312971 | 11/1998 |
| JP | 2000-21789 | 1/2000 |
| JP | 2000-164989 | 6/2000 |
| JP | 2000-269144 | 9/2000 |

OTHER PUBLICATIONS

S. Nakamura et al., "Long lifetime violet InGaN/GaN/AlGaN–based semiconductor lasers", Journal of Oyo Denshi Bussei Bunkakai, vol. 4, (1998), pp. 53–58 and 210–215.
Akira Usui et al., "Thick GaN Epitaxial Growth with Low Dislocation Density by Hydride Vapor Phase Epitaxy", Jpn. J. Appl. Phys. vol. 36 (1997), pp. L899–L902.

* cited by examiner

Primary Examiner—Cathy Lam
(74) Attorney, Agent, or Firm—McDermott, Will & Emery

(57) ABSTRACT

A nitride-based semiconductor element enabling formation of a nitride-based semiconductor layer having low dislocation density, consisting of a material different from that of an underlayer, on the underlayer with a small thickness is obtained. This nitride-based semiconductor element comprises a plurality of mask layers formed at a prescribed interval to be in contact with the upper surface of the underlayer while partially exposing the underlayer and the nitride-based semiconductor layer, formed on the upper surface of the underlayer and the mask layers, consisting of the material different from that of the underlayer. The minimum distance between adjacent mask layers is smaller than the width of an exposed part of the underlayer located between the adjacent mask layers.

23 Claims, 11 Drawing Sheets

US 6,759,139 B2

NITRIDE-BASED SEMICONDUCTOR ELEMENT AND METHOD OF FORMING NITRIDE-BASED SEMICONDUCTOR

BACKGROUND OF THE INVENTION

1. Field of the Invention

The present invention relates to a nitride-based semiconductor element and a method of forming a nitride-based semiconductor, and more particularly, it relates to a nitride-based semiconductor element having a nitride-based semiconductor, consisting of a material different from that of an underlayer, formed on the underlayer by hetero growth and a method of forming a nitride-based semiconductor.

2. Description of the Prior Art

A technique of hetero-growth about a nitride-based semiconductor consisting of a material different from that of an underlayer on the underlayer is known in general. For example, a crystal of GaN, which is one of nitride-based semiconductors lattice-matching with only a small number of types of substrates, is grown on a heterogeneous substrate such as a sapphire substrate to form hetero structure. In relation to this, generally known is a technique of inserting a buffer layer grown at a low temperature between the substrate and a GaN layer for growing GaN in excellent crystallinity with a small number of crystal defects.

Even if the aforementioned low-temperature buffer layer is employed, however, the density of reducible defects is limited and it is difficult to reduce the number of dislocations. To this end, a technique of employing an underlayer reduced in number of dislocations by epitaxial lateral overgrowth (ELOG) of GaN is proposed in general. This epitaxial lateral overgrowth is disclosed in Journal of Oyo Denshi Bussei Bunkakai, Vol. 4 (1998), pp. 53 to 58 and 210 to 215, for example.

FIGS. 20 to 25 are sectional views for illustrating an exemplary conventional method of forming a nitride-based semiconductor through epitaxial lateral overgrowth. This conventional method of forming a nitride-based semiconductor through epitaxial lateral overgrowth is now described with reference to FIGS. 20 to 23.

First, a low-temperature buffer layer 202 is formed on a sapphire substrate 201, and thereafter a GaN layer 203 for serving as an underlayer is grown on the low-temperature buffer layer 202, as shown in FIG. 20.

Then, striped (elongated) mask layers 204 of $SiO_2$ or the like are formed on prescribed regions of the GaN layer 203, as shown in FIG. 21. The mask layers 204 are employed as selective growth masks for making re-growth from the GaN layer 203 serving as an underlayer, thereby forming GaN layers 205 having a facet structure with a triangular section on exposed parts of the GaN layer 203.

Then, the facet GaN layers 205 are bonded to each other and dominated by lateral growth, as shown in FIG. 22. Therefore, dislocations extending in the c-axis direction are bent on the bonded portions of the facets not to reach upper portions. However, the dislocations remain on the bonded portions of the facets.

Then, the facet GaN layers 205 coalesce into a continuous GaN layer 205 having a flat upper surface, as shown in FIG. 23. The number of dislocations reaching the flattened surface of the GaN layer 205 is remarkably reduced as compared with the underlayer.

In the conventional method of forming a nitride-based semiconductor shown in FIGS. 20 to 23, dislocations concentrically remain on upper portions of the mask layers 204 where the facets are bonded to each other when the GaN layer 205 is formed by epitaxial lateral overgrowth. In order to reduce the number of dislocations, therefore, the mask layers 204 are preferably reduced in width. If the width of the mask layers 204 is reduced in order to reduce the number of dislocations, however, the exposed parts of the GaN layer 203 serving as an underlayer are increased in width, and hence the facets of GaN formed on the exposed parts of the GaN layer 203 are also increased in width (height). In order to bond the large facets and flatten the upper surface of the GaN layer 205, therefore, the GaN layer 205 must be thickly formed. Thus, it is generally difficult to obtain the GaN layer 205 having a small number of dislocations with a small thickness.

A method of growing a GaN layer through epitaxial lateral overgrowth by directly forming mask layers on a substrate is also proposed in general. FIG. 24 is a sectional view for illustrating the conventional proposed method of forming a nitride-based semiconductor. Referring to FIG. 24, mask layer 212 of $SiO_2$ are directly formed on a sapphire substrate 211 for forming low-temperature buffer layers 213 of GaN and a GaN layer 214 of high-temperature growth thereon, thereby forming a GaN layer 214 reduced in number of dislocations by single growth. According to this conventional proposed method, the mask layers 212 are directly formed on the sapphire substrate 211, and hence the total thickness is reduced due to absence of an underlayer.

However, the conventional proposed method shown in FIG. 24 has a problem similar to that in the prior art shown in FIGS. 20 to 23. Also when the mask layers 212 are directly formed on the sapphire substrate 211 for making epitaxial lateral overgrowth, the mask layers 212 must be reduced in width in order to reduce the number of dislocations. If the width of the mask layers 212 is reduced, however, exposed areas of the sapphire substrate 211 are increased to increase the size (height) of GaN facets formed on the low-temperature buffer layers 213 located on the exposed parts. In order to bond the large facets to each other for flattening the GaN layer 214, therefore, the GaN layer 214 must be formed in a large thickness of at least about 5 $\mu$m. Consequently, it is difficult to obtain the GaN layer 214 having a small number of dislocations with a small thickness also in the conventional proposed method shown in FIG. 24.

When a mixed crystal of AlGaN, InN, InGaN, BGaN, BAlGaN, BInGaN or AlInGaN is thickly grown, it is more difficult to obtain a lattice-matching substrate in general. For example, it is difficult to thickly grow an InGaN layer directly on a sapphire substrate, due to remarkable difference between lattice constants. In general, therefore, a GaN layer 223 is first grown on a sapphire substrate 221 through a buffer layer 222, as shown in FIG. 25. Mask layers 224 are formed on the GaN layer 223 and thereafter employed as growth masks for making epitaxial lateral overgrowth, thereby forming a low-dislocation GaN layer 225. An InGaN layer 226 is grown on the low-dislocation GaN layer 225. Thus, the InGaN layer 226 having low dislocation density can be somewhat thickly grown on the low-dislocation GaN layer 225 formed by epitaxial lateral overgrowth.

In the conventional method of forming a nitride-based semiconductor consisting of a mixed crystal shown in FIG. 25, however, the low-dislocation GaN layer 225 must be formed as an underlayer by epitaxial lateral overgrowth in order to obtain the InGaN layer 226 having a small number of dislocations, as hereinabove described. In the prior art shown in FIG. 25, therefore, the total thickness is so increased that it is consequently difficult to obtain the InGaN layer 226 having a small number of dislocations with a small thickness as a whole. In the conventional method of forming a nitride-based semiconductor consisting of a mixed crystal shown in FIG. 25, further, the InGaN layer 226 is grown on the GaN underlayer 225 formed by epitaxial lateral overgrowth, and hence the steps are disadvantageously complicated.

SUMMARY OF THE INVENTION

An object of the present invention is to provide a nitride-based semiconductor element having a structure enabling formation of a nitride-based semiconductor layer having a small number of dislocations with a small thickness when a nitride-based semiconductor consisting of a material different from that of an underlayer is formed on the underlayer by hetero growth.

Another object of the present invention is to provide a method of forming a nitride-based semiconductor capable of readily growing a nitride-based semiconductor layer having a small number of dislocations with a small thickness when a nitride-based semiconductor consisting of a material different from that of an underlayer is formed on the underlayer by hetero growth.

A nitride-based semiconductor element according to a first aspect of the present invention comprises a plurality of mask layers formed at a prescribed interval to come into contact with the upper surface of an underlayer while partially exposing the underlayer, and a nitride-based semiconductor layer, formed on the upper surface of the underlayer and the mask layers, consisting of a material different from that of the underlayer, while the minimum distance between adjacent mask layers is smaller than the width of an exposed part of the underlayer located between the adjacent mask layers.

The nitride-based semiconductor element according to the first aspect is so structured that the minimum distance between adjacent mask layers is smaller than the width of the exposed part of the underlayer located between the adjacent mask layers as hereinabove described, whereby raw material hardly reaches a portion of the exposed part of the underlayer formed with any mask layer thereon when the nitride-based semiconductor layer of the material different from that of the underlayer is grown on the underlayer through the mask layers serving as masks. Thus, a facet smaller than that formed on a portion of the exposed part of the underlayer formed with no mask layer thereon is formed on the portion of the exposed part of the underlayer formed with any mask layer thereon. The smaller facet is laterally grown more quickly than the larger facet, whereby lateral growth is facilitated with a thickness smaller than a general one from an initial stage of growth. Thus, the nitride-based semiconductor layer, having low dislocation density, consisting of the material different from that of the underlayer can be hetero-grown on the underlayer with a small thickness.

In the aforementioned nitride-based semiconductor element according to the first aspect, the underlayer preferably includes a substrate, and the mask layers are preferably formed to be in contact with the upper surface of the substrate. In the present invention, the substrate includes only the substrate itself, with inclusion of no substrate formed with a layer thereon.

The aforementioned nitride-based semiconductor element according to the first aspect preferably further comprises facets, formed on an exposed part of the upper surface of the underlayer located between the adjacent mask layers, having at least two types of different sizes. According to this structure, a smaller facet laterally grows more quickly than a larger facet, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness to form hetero structure.

In the aforementioned nitride-based semiconductor element according to the first aspect, the nitride-based semiconductor layer is preferably formed on the upper surface of the underlayer through a buffer layer. According to this structure, the nitride-based semiconductor layer can be grown on the underlayer through the buffer layer in smaller dislocation density with a small thickness. The buffer layer facilitates crystal growth, whereby a larger number of small facets can be formed on the buffer layer located on a portion of the exposed part of the underlayer formed with any mask layer thereon. Thus, lateral growth can be further facilitated. Consequently, the nitride-based semiconductor layer having low dislocation density can be grown with a smaller thickness to form hetero structure.

In the aforementioned nitride-based semiconductor element according to the first aspect, the nitride-based semiconductor layer is preferably formed to be in contact with the upper surface of the underlayer. According to this structure, the nitride-based semiconductor layer having low dislocation density can be directly hetero-grown on the underlayer with a small thickness.

In the aforementioned nitride-based semiconductor element according to the first aspect, the mask layers preferably have overhangs protruding above an exposed part of the underlayer. According to this structure, raw material hardly reaches portions of the exposed part of the underlayer located under the overhangs, whereby facets smaller than those formed on portions of the exposed part of the underlayer not located under the overhangs can be readily formed. The smaller facets are laterally grown more quickly than the larger facets, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness to form hetero structure. In this case, the mask layers are preferably at least partially inverse-trapezoidal.

In the aforementioned nitride-based semiconductor element according to the first aspect, the underlayer preferably includes projection portions, the projection portions are preferably inverse-trapezoidal, and the mask layers are preferably formed to be in contact with the upper surfaces of the inverse-trapezoidal projection portions. According to this structure, the inverse-trapezoidal projection portions of the underlayer have overhanging shapes, whereby the minimum distance between adjacent mask layers can be readily reduced below the width of the exposed part of the underlayer located between the adjacent mask layers by forming the mask layers on the projection portions.

In the aforementioned nitride-based semiconductor element according to the first aspect, the underlayer preferably includes projection portions, and the mask layers are preferably formed to be in contact with the upper surfaces of the projection portions so that side portions of the mask layers protrude from the projection portions. According to this structure, the mask layers having the overhangs protruding above the exposed part of the underlayer can be readily formed.

In the aforementioned nitride-based semiconductor element according to the first aspect, the mask layers preferably include a first mask layer formed to be in contact with the upper surface of the underlayer, and a second mask layer, formed on the first mask layer, consisting of a material harder to etch than the first mask layer. According to this structure, the mask layers having the overhangs protruding above the exposed part of the underlayer can be readily formed by providing an etching mask on a prescribed region of the second mask layer and thereafter etching the second and first mask layers through the etching mask.

The aforementioned nitride-based semiconductor element according to the first aspect preferably further comprises a nitride-based semiconductor element layer, formed on the nitride-based semiconductor layer, having an element region. According to this structure, the nitride-based semiconductor element layer having an element region can be grown on the nitride-based semiconductor layer having low dislocation density formed on the underlayer with a small thickness, whereby the nitride-based semiconductor element layer can be obtained with excellent element characteristics. Consequently, a nitride-based semiconductor element having a small thickness and excellent element characteristics can be obtained.

A method of forming a nitride-based semiconductor according to a second aspect of the present invention comprises steps of forming a plurality of mask layers at a prescribed interval to be in contact with the upper surface of an underlayer while partially exposing the underlayer, and growing a nitride-based semiconductor layer consisting of a material different from that of the underlayer on the upper surface of the underlayer and the mask layers, while the minimum distance between adjacent mask layers is smaller than the width of an exposed part of the underlayer located between the adjacent mask layers.

The method of forming a nitride-based semiconductor according to the second aspect is so structured that the minimum distance between adjacent mask layers is smaller than the width of the exposed part of the underlayer located between the adjacent mask layers as hereinabove described, whereby raw material hardly reaches a portion of the exposed part of the underlayer formed with any mask layer thereon when the nitride-based semiconductor layer is grown on the underlayer through the mask layers serving as masks. Thus, a facet smaller than that formed on a portion of the exposed part of the underlayer formed with no mask layer thereon is formed in the portion of the exposed part of the underlayer formed with any mask layer thereon. The smaller facet is laterally grown more quickly than the larger facet, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness to form hetero structure.

In the aforementioned method of forming a nitride-based semiconductor according to the second aspect, the step of growing the nitride-based semiconductor layer preferably includes a step of growing the nitride-based semiconductor layer on the upper surface of the underlayer through a buffer layer. According to this structure, the nitride-based semiconductor layer can be grown on the underlayer through the buffer layer in smaller dislocation density with a small thickness. The buffer layer facilitates crystal growth, whereby a larger number of small facets can be formed on a portion of the exposed part of the underlayer formed with any mask layer thereon. Thus, lateral growth can be further facilitated. Consequently, the nitride-based semiconductor layer having low dislocation density can be grown with a smaller thickness to form hetero structure.

In the aforementioned method of forming a nitride-based semiconductor according to the second aspect, the step of growing the nitride-based semiconductor layer preferably includes a step of growing the nitride-based semiconductor layer to be in contact with the upper surface of the underlayer. According to this structure, the nitride-based semiconductor layer having low dislocation density can be directly grown on the underlayer with a small thickness to form hetero structure.

In the aforementioned method of forming a nitride-based semiconductor according to the second aspect, the mask layers preferably have overhangs protruding above an exposed part of the underlayer. According to this structure, raw material hardly reaches portions of the exposed part of the underlayer located under the overhangs. Thus, facets smaller than those formed on portions of the exposed part of the underlayer not located under the overhangs can be readily formed in portions of the exposed part of the underlayer located under the overhangs. The smaller facets are laterally grown more quickly than the larger facets, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness. In this case, the mask layers are preferably at least partially inverse-trapezoidal.

In the aforementioned method of forming a nitride-based semiconductor according to the second aspect, the underlayer preferably includes a substrate, and the mask layers are preferably formed to be in contact with the upper surface of the substrate. In the present invention, the substrate includes only the substrate itself, with inclusion of no substrate formed with a layer thereon.

In the aforementioned method of forming a nitride-based semiconductor according to the second aspect, the underlayer preferably includes projection portions, the projection portions are preferably inverse-trapezoidal, and the mask layers are preferably formed to be in contact with the upper surfaces of the inverse-trapezoidal projection portions. According to this structure, the inverse-trapezoidal projection portions of the underlayer have overhanging shapes, whereby the minimum distance between adjacent mask layers can be readily reduced below the width of the exposed part of the underlayer located between the adjacent mask layers by forming the mask layers on the projection portions.

In the aforementioned method of forming a nitride-based semiconductor according to the second aspect, the underlayer preferably includes projection portions, and the mask layers are preferably formed to be in contact with the upper surfaces of the projection portions so that side portions of the mask layers protrude from the projection portions. According to this structure, the mask layers having the overhangs protruding above the exposed part of the underlayer can be readily formed.

In the aforementioned method of forming a nitride-based semiconductor according to the second aspect, the step of forming the mask layers preferably includes steps of forming a first mask layer to be in contact with the upper surface of the underlayer, forming a second mask layer consisting of a material harder to etch than the first mask layer on the first mask layer, and forming an etching mask on a prescribed region of the second mask layer and thereafter etching the second mask layer and the first mask layer through the etching mask serving as a mask thereby forming overhanging mask layers. According to this structure, the mask layers having the overhangs protruding above the exposed part of the underlayer can be readily formed.

The aforementioned method of forming a nitride-based semiconductor according to the second aspect preferably further comprises a step of growing a nitride-based semiconductor element layer having an element region on the nitride-based semiconductor layer. According to this structure, the nitride-based semiconductor element layer having an element region can be grown on the nitride-based semiconductor layer having low dislocation density formed on the underlayer with a small thickness, whereby the nitride-based semiconductor element layer can be readily formed with excellent element characteristics. Consequently, a nitride-based semiconductor element having a small thickness and excellent element characteristics can be obtained.

A method of forming a nitride-based semiconductor according to a third aspect of the present invention comprises steps of forming a plurality of mask layers at a prescribed interval to be in contact with the upper surface of an underlayer while partially exposing the underlayer, and growing a nitride-based semiconductor layer consisting of a material different from that of the underlayer on an exposed part of the upper surface of the underlayer located between adjacent mask layers to have difference in growth rate.

In the method of forming a nitride-based semiconductor according to the third aspect, the nitride-based semiconductor layer is grown on the exposed upper surface of the underlayer located between the adjacent mask layers to have difference in growth rate, whereby a small facet is formed on a portion having a low growth rate. The small facet is laterally grown more quickly than a larger facet, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness to form hetero structure.

In the aforementioned method of forming a nitride-based semiconductor according to the third aspect, the step of growing the nitride-based semiconductor layer includes a step of growing facets having at least two types of different sizes on the exposed part of the upper surface of the underlayer located between the adjacent mask layers thereby growing the nitride-based semiconductor layer. According to this structure, a smaller facet is laterally grown more quickly than a larger facet, whereby lateral growth is facilitated with a thickness smaller than a general one from an initial stage of growth. Thus, the nitride-based semiconductor layer, having low dislocation density, consisting of the material different from that of the underlayer can be grown on the underlayer with a small thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Before describing embodiments of the present invention, the concept of the present invention is described. The concept of the present invention is now described with reference to FIGS. 1 to 3.

Figure 1:
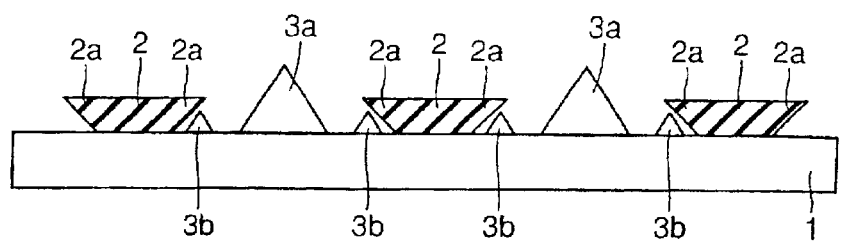
FIGS. 1 to 3 are sectional views for illustrating the concept of a method of forming a nitride-based semiconductor according to the present invention.

According to the present invention, inverse-trapezoidal mask layers 2 having overhangs 2a are first formed on an underlayer 1 consisting of an underlayer substrate or an underlayer formed on a substrate, as shown in FIG. 1. The minimum distance between adjacent mask layers 2 is smaller than the width of exposed parts of the underlayer 1 located between the adjacent mask layers 2. The mask layers 2 are employed as selective growth masks for epitaxially laterally overgrowing a nitride-based semiconductor layer 3 on the underlayer 1. In this case, the quantities of raw material supplied to regions of the exposed parts of the underlayer 1 located under the overhangs 2a and those not located under the overhangs 2a are different from each other. In other words, the raw material hardly reaches the regions located under the overhangs 2a, and hence small facets 3b are formed on these regions. In central portions of the regions of the exposed parts of the underlayer 1 not located under the overhangs 2a, on the other hand, growth in the c-axis direction quickly progresses due to a large quantity of the raw material, whereby large-facets 3a are formed on these portions.

While FIG. 1 illustrates a small facet 3b under each overhang 2a for the purpose of simplifying the illustration, a plurality of small facets 3b are formed under each overhang 2a in practice. The plurality of small facets 3b (not shown) formed under each overhang 2a are gradually increased in size toward the central portion of the exposed part of the underlayer 1.

Figure 2:
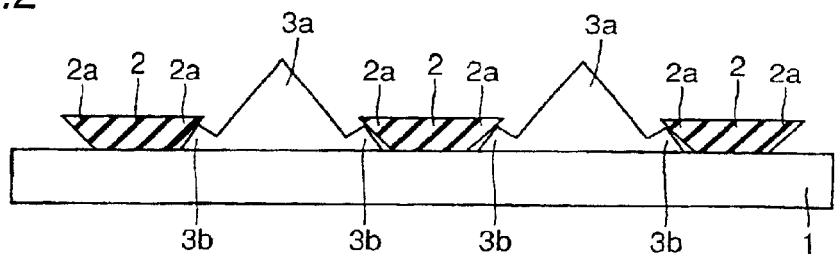
Figure 3:
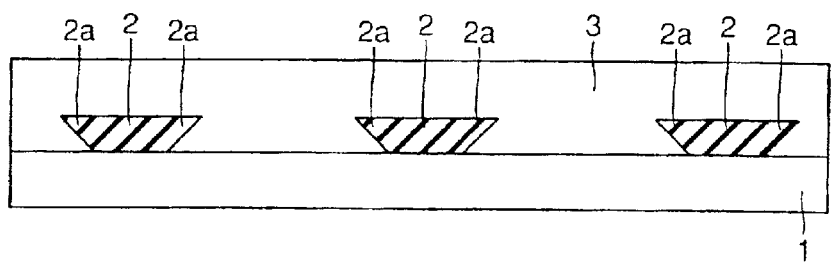

From the state shown in FIG. 1, the small facets 3b are laterally grown more quickly than the large facets 3a, thereby facilitating lateral growth with a thickness smaller than a general one from an initial stage of growth. Thus, the small facets 3b are dominated by lateral growth in an early stage, and come into contact with the large facets 3a to bend dislocations as shown in FIG. 2. Dislocations start to bend from portions of the large facets 3a coming into contact with the small facets 3b, to facilitate lateral growth.

Thus, according to the present invention, lateral growth is dominant from portions having an extremely small thickness, for flattening the nitride-based semiconductor layer 3 with a small thickness and already reducing the number of dislocations in the vicinity of the underlayer 1. Thus, the nitride-based semiconductor layer 3, having low dislocation density, consisting of a material different from that of the underlayer 1 can be grown on the underlayer 1 with a small thickness to form hetero structure.

Embodiments embodying the aforementioned concept of the present invention are now described.

(First Embodiment)

A method of forming a nitride-based semiconductor according to a first embodiment of the present invention is described with reference to FIG. 4. According to the first embodiment, mask layers 12 of SiN are directly formed on the upper surface of a sapphire substrate 11 serving as an underlayer. The mask layers 12 are formed in an inverse mesa shape (inverse-trapezoidal shape) to have overhangs 12a. The minimum distance between adjacent mask layers 12 is smaller then the width of exposed parts of the sapphire substrate 11 located between the adjacent mask layers 12.

In order to form the mask layers 12, an SiN layer (not shown) is first formed on the overall upper surface of the sapphire substrate 11, followed by formation of resist films (not shown) on prescribed regions of the SiN layer. The inverse-trapezoidal mask layers 12 having the overhangs 12a can be readily formed by wet-etching the SiN layer through the resist films serving as masks. The mask layers 12 are formed in a striped (elongated) shape having a cycle of about 7 μm in a thickness of about 10 nm to about 1000 nm. Openings of the mask layers 12 are preferably formed in the [11-20] direction or the [1-100] direction of the sapphire substrate 11, for example.

Thereafter low-temperature buffer layers 13 of AlGaN or GaN having a thickness of about 10 nm to about 50 nm are grown on the sapphire substrate 1 by MOCVD or HVPE under a temperature condition of about 500° C. to about 700° C. An undoped GaN layer 14 is formed on the low-temperature buffer layers 13 by MOCVD or HVPE through the mask layers 12 serving as selective growth masks. The undoped GaN layer 14 is formed to have a thickness of about 2 μm under a temperature condition of about 950° C. to about 1200° C. The undoped GaN layer 14 is an example of the "nitride-based semiconductor layer" according to the present invention.

Also when the undoped GaN layer 14 is epitaxially laterally overgrown, small facets are formed under the overhangs 12a of the mask layers 12, similarly to the conceptual diagram shown in FIG. 1. Thus, lateral growth is dominant from an initial stage of growth, whereby the undoped GaN layer 14 reduced in number of dislocations can be grown on the sapphire substrate 11 with a small thickness to form hetero structure.

The low-temperature buffer layers 13 formed between the sapphire substrate 11 and the undoped GaN layer 14 further facilitate crystal growth of the undoped GaN layer 14, whereby a larger number of small facets can be formed on the low-temperature buffer layers 13 located under the overhangs 12a. Thus, lateral growth can be further facilitated, for growing the undoped GaN layer 14 having low dislocation density on the sapphire substrate 11 with a smaller thickness.

The structure of a semiconductor laser device fabricated with the method of forming a nitride-based semiconductor according to the first embodiment is now described with reference to FIG. 5.

Figure 4:
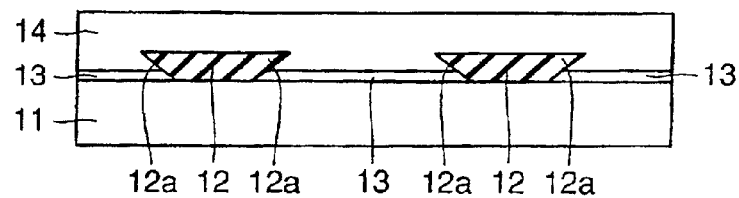
FIG. 4 is a sectional view for illustrating a method of forming a nitride-based semiconductor according to a first embodiment of the present invention.
Figure 5:
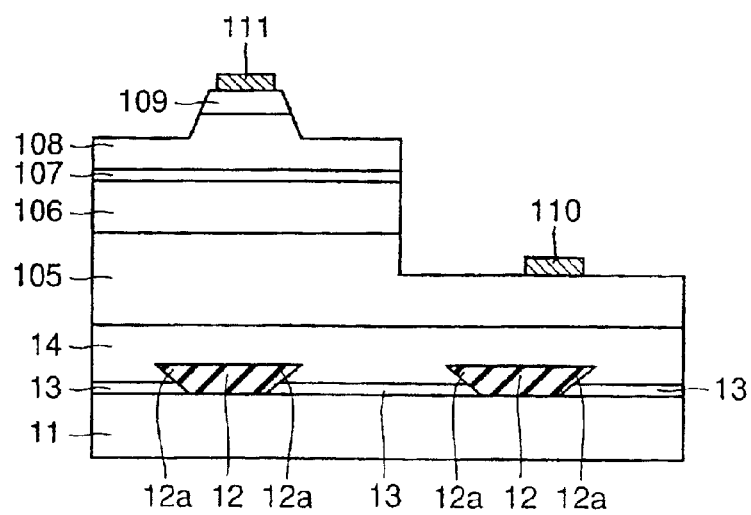
FIG. 5 is a sectional view showing a semiconductor laser device fabricated with the method of forming a nitride-based semiconductor according to the first embodiment shown in FIG. 4.

In the semiconductor laser device according to the first embodiment, a first conductivity type contact layer 105 of n-type GaN having a thickness of about 4 μm is formed on the undoped GaN layer 14 shown in FIG. 4, as shown in FIG. 5. A first conductivity type cladding layer 106 of n-type AlGaN having a thickness of about 0.45 μm is formed on the first conductivity type contact layer 105. A multiple quantum well (MQW) emission layer 107 of InGaN is formed on the first conductivity type cladding layer 106. A second conductivity type cladding layer 108 of p-type AlGaN having a thickness of about 0.45 μm is formed on the MQW emission layer 107. A second conductivity type contact layer 109 of p-type GaN having a thickness of about 0.15 μm is formed on the second conductivity type cladding layer 108. An n-side electrode 110 is formed on an exposed upper surface of the first conductivity type contact layer 105. A p-side electrode 111 is formed on the upper surface of the second conductivity type contact layer 109.

The first conductivity type contact layer 105, the first conductivity type cladding layer 106, the MQW emission layer 107, the second conductivity type cladding layer 108 and the second conductivity type contact layer 109 are examples of the "nitride-based semiconductor element layer" according to the present invention.

In the aforementioned semiconductor laser device according to the first embodiment, the layers 105 to 109 are formed on the undoped GaN layer 14, reduced in number of dislocations, having a small thickness formed by the method shown in FIG. 4, whereby excellent crystallinity can be implemented in the layers 105 to 109. According to the first embodiment, therefore, a semiconductor laser device having a small thickness and excellent device characteristics can be obtained.

(Second Embodiment)

A method of forming a nitride-based semiconductor according to a second embodiment of the present invention is described with reference to FIG. 6. According to the second embodiment, mask layers 22 are formed on the surface of an n-type SiC substrate 21 serving as an underlayer. Each mask layer 22 has a three-layer structure consisting of an SiN layer 22a, an $SiO_2$ layer 22b and an SiN layer 22c with a thickness of about 10 nm to about 1000 nm. In each mask layer 22, the intermediate $SiO_2$ layer 22b protrudes on both sides (overhangs). The minimum distance between adjacent mask layers 22 ($SiO_2$ layers 22b) is smaller than the width of an exposed part of the n-type SiC substrate 21 located between the adjacent mask layers 22.

In order to form the mask layers 22, the SiN layers 22a, the $SiO_2$ layers 22b and the SiN layers 22c are successively formed on the n-type SiC substrate 21, followed by formation of resist films (not shown) on prescribed regions of the SiN layers 22c. The resist films are employed as masks for performing wet etching with a hydrofluoric acid-based etching solution, thereby forming the overhanging mask layers 22 shown in FIG. 6 through the difference between the etching rates for the $SiO_2$ layers 22b and the SiN layers 22a and 22c.

Thereafter low-temperature buffer layers 23 of AlGaN or GaN having a thickness of about 10 nm to about 50 nm are formed on the n-type SiC substrate 21 by MOCVD or HVPE under a temperature condition of about 500° C. to about 700° C. An n-type GaN layer 24 is grown on the low-temperature buffer layers 23 by MOCVD or HVPE through the mask layers 22 serving as selective growth masks. The n-type GaN layer 24 is formed in a thickness of about 2 μm under a temperature condition of about 950° C. to about 1200° C. The n-type GaN layer 24 is an example of the "nitride-based semiconductor layer" according to the present invention.

Also in the second embodiment, small facets are formed under the overhangs of the mask layers 22 similarly to the conceptual diagram shown in FIG. 1, whereby lateral growth is facilitated with a thickness smaller than a general one from an initial stage of growth. Thus, the n-type GaN layer 24 having low dislocation density can be grown on the n-type SiC substrate 21 with a small thickness to form hetero structure.

The low-temperature buffer layers 23 formed between the n-type SiC substrate 21 and the n-type GaN layer 24 further facilitate crystal growth of the n-type GaN layer 24, whereby a larger number of small facets can be formed on the low-temperature buffer layers 23 located under the overhangs. Thus, lateral growth can be further facilitated, for hetero-growing the n-type GaN layer 24 having low dislocation density on the n-type SiC substrate 21 with a smaller thickness.

The structure of a semiconductor laser device fabricated with the method of forming a nitride-based semiconductor according to the second embodiment is now described with reference to FIG. 7. In the semiconductor laser device according to the second embodiment, a first conductivity type contact layer 115 of n-type GaN having a thickness of about 4 μm is formed on the n-type GaN layer 24 shown in FIG. 6, as shown in FIG. 7. A first conductivity type cladding layer 116 of n-type AlGaN having a thickness of about 0.45 μm is formed on the first conductivity type contact layer 115. A multiple quantum well (MQW) emission layer 117 of InGaN is formed on the first conductivity type cladding layer 116. A second conductivity type cladding layer 118 of p-type AlGaN having a thickness of about 0.45 μm is formed on the MQW emission layer 117. A second conductivity type contact layer 119 of p-type GaN having a thickness of about 0.15 μm is formed on the second conductivity type cladding layer 118. An n-side electrode 120 is formed on the back surface of the n-type SiC substrate 21. A p-side electrode 121 is formed on the upper surface of the second conductivity type contact layer 119.

The first conductivity type contact layer 115, the first conductivity type cladding layer 116, the MQW emission layer 117, the second conductivity type cladding layer 118 and the second conductivity type contact layer 119 are examples of the "nitride-based semiconductor element layer" according to the present invention.

In the semiconductor laser device according to the second embodiment, the n-type GaN layer 24 reduced in number of dislocations is formed with a small thickness followed by formation of the layers 115 to 119 thereon, whereby excellent crystallinity can be implemented in the layers 115 to 119. Thus, a semiconductor laser device having a small thickness and excellent device characteristics can be obtained according to the second embodiment.

Figure 6:
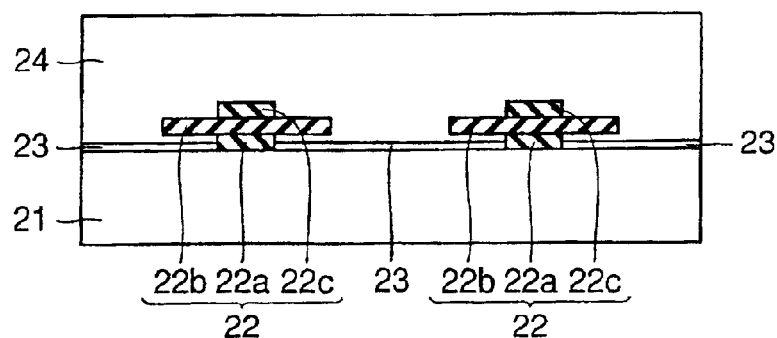
FIG. 6 is a sectional view for illustrating a method of forming a nitride-based semiconductor according to a second embodiment of the present invention.
Figure 7:
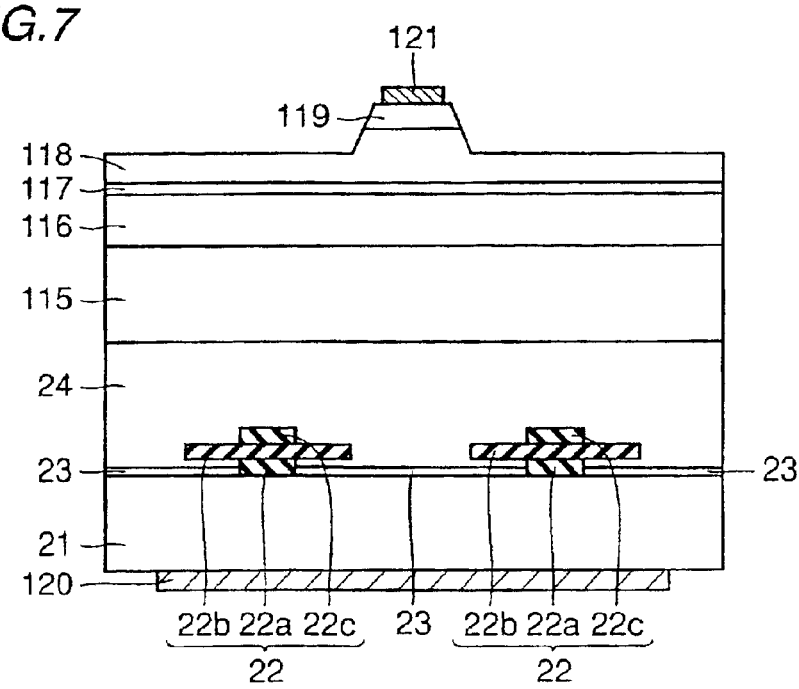
FIG. 7 is a sectional view showing a semiconductor laser device fabricated with the method of forming a nitride-based semiconductor according to the second embodiment shown in FIG. 6.

While the overhanging mask layers 22 shown in FIG. 6 are formed through the difference between the etching rates for the intermediate $SiO_2$ layers 22b and the lower and upper SiN layers 22a and 22c in the aforementioned second embodiment, other materials may alternatively be employed so far as the upper and lower layers are made of a material easier to etch than that for the intermediate layers. For example, the upper or lower layers may be made of a metal such as tungsten and the intermediate layers may be made of $SiO_2$, SiN, $TiO_2$ or TiN.

(Third Embodiment)

Figure 8:
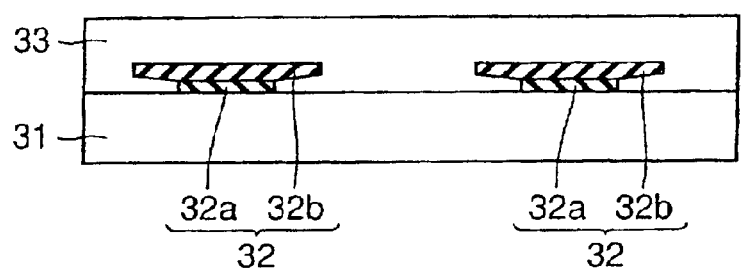
FIG. 8 is a sectional view for illustrating a method of forming a nitride-based semiconductor according to a third embodiment of the present invention.

A method of forming a nitride-based semiconductor according to a third embodiment of the present invention is described with reference to FIG. 8. According to the third embodiment, mask layers 32 having overhangs are directly formed on a sapphire substrate 31 serving as an underlayer. Each mask layer 32 has a two-layer structure consisting of a lower SiN layer 32a formed by plasma CVD with RF power of 150 W and an upper SiN layer 32b formed by plasma CVD with RF power of 250 W, and a thickness of about 50 nm to about 1000 nm. In this case, the upper SiN layer 32b formed in the aforementioned manner is harder to etch than the lower SiN layer 32a.

In order to form the mask layers 32, the lower SiN layers 32a and the upper SiN layers 32b are successively formed on the overall surface of the sapphire substrate 31 under the aforementioned conditions, followed by formation of resist films (not shown) on prescribed regions of the upper SiN layers 32b. The resist films are employed as masks for wet-etching the upper SiN layers 32b and the lower SiN layers 32a with buffered hydrofluoric acid, thereby forming the overhanging mask layers 32 of the two-layer structure shown in FIG. 8. The minimum distance between adjacent mask layers 32 (SiN layers 32b) is smaller than the width of an exposed part of the sapphire substrate 31 located between the adjacent mask layers 32.

Thereafter the mask layers 32 are employed as selective growth masks for epitaxially laterally overgrowing an undoped GaN layer 33 on the sapphire substrate 31 under a high temperature by MOCVD or HVPE. Also in the third embodiment, small facets are formed under the overhangs of the mask layers 32 similarly to the conceptual diagram shown in FIG. 1. The small facets are laterally grown more quickly than large facets, whereby lateral growth is facilitated with a thickness smaller than a general one from an initial stage of growth. Thus, the undoped GaN layer 33 having low dislocation density can be grown on the sapphire substrate 31 with a small thickness to form hetero structure. The undoped GaN layer 33 is an example of the "nitride-based semiconductor layer" according to the present invention.

Figure 9:
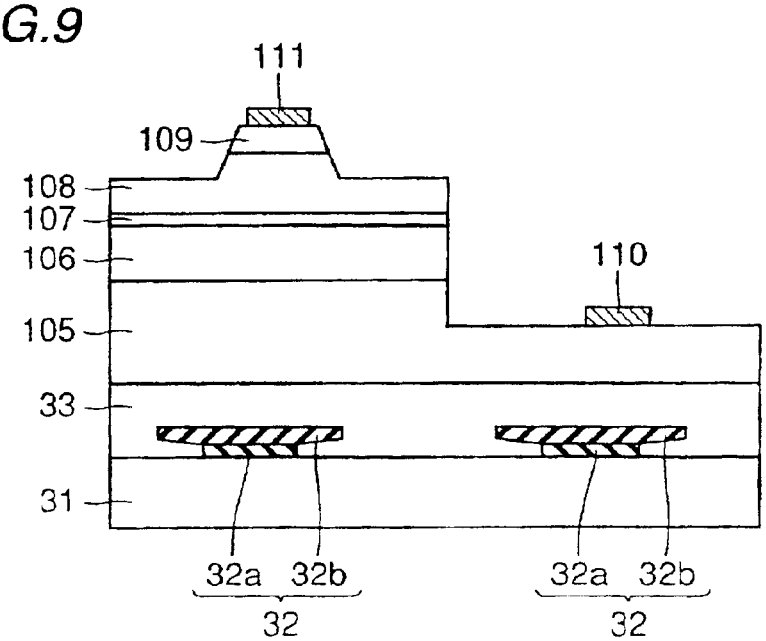
FIG. 9 is a sectional view showing a semiconductor laser device fabricated with the method of forming a nitride-based semiconductor according to the third embodiment shown in FIG. 8.

A semiconductor laser device fabricated with the method of forming a nitride-based semiconductor according to the third embodiment is described with reference to FIG. 9. In this semiconductor laser device, a first conductivity type contact layer 105, a first conductivity type cladding layer 106, an MQW emission layer 107, a second conductivity type cladding layer 108, a second conductivity type contact layer 109, an n-side electrode 110 and a p-side electrode 111 are formed on the undoped GaN layer 33 shown in FIG. 8, as shown in FIG. 9. The compositions and the thicknesses of the layers 105 to 109 are similar to those of the semiconductor laser device according to the first embodiment shown in FIG. 5.

According to the third embodiment, the layers 105 to 109 are formed on the undoped GaN layer 33 having low dislocation density formed with a small thickness, whereby excellent crystallinity can be implemented in the layers 105 to 109. Consequently, a semiconductor laser device having a small thickness and excellent characteristics can be obtained according to the third embodiment, similarly to the first embodiment.

(Fourth Embodiment)

A method of forming a nitride-based semiconductor according to a fourth embodiment of the present invention is described with reference to FIG. 10. According to the fourth embodiment, inverse mesa (inverse-trapezoidal) mask layers 42 having overhangs 42a consisting of tungsten (W) are formed on an n-type SiC substrate 41 serving as an underlayer. The mask layers 42 are formed in the shape of stripes having a thickness of about 10 nm to about 1000 nm and a cycle of about 5 $\mu$m. The minimum distance between adjacent mask layers 42 is smaller than the width of an exposed part of the n-type SiC substrate 41 located between the adjacent mask layers 42.

In order to form the mask layers 42 having the overhangs 42a consisting of W, a W layer (not shown) is formed on the overall surface of the n-type SiC substrate 41, followed by formation of resist films (not shown) on prescribed regions of the W layer. The resist films are employed as masks for etching the W layer under over-etching conditions. Thus, the mask layers 42 having the overhangs 42a consisting of W are formed.

Figure 25:
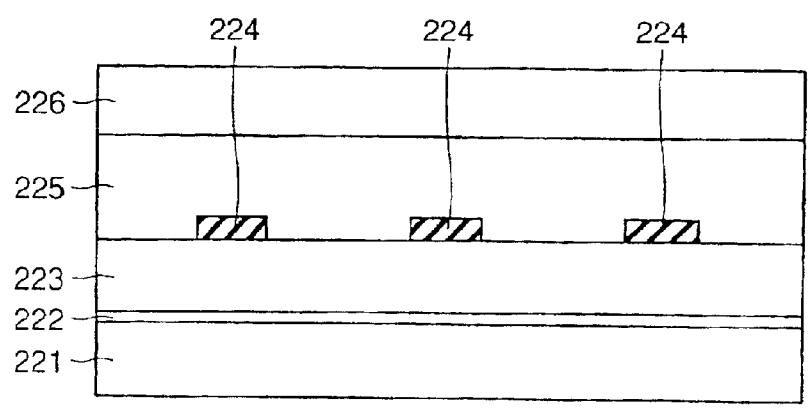
FIG. 25 is a sectional view for illustrating a conventional method of forming a nitride-based semiconductor consisting of a mixed crystal.

Thereafter the mask layers 42 are employed as selective growth masks for selectively growing an n-type InGaN layer 43 on the n-type SiC substrate 41 by MOCVD or HVPE. The InGaN layer 43 is formed in a thickness of about 2 $\mu$m under a temperature condition of about 650° C. to about 900° C. When the InGaN layer 43 is directly grown on the n-type SiC substrate 41, small facets similar to those shown in the conceptual diagram of FIG. 1 are formed under the overhangs 42a of the mask layers 42. The small facets facilitate lateral growth, and hence the InGaN layer 43 having low dislocation density can be thickly grown on the n-type SiC substrate 41 without providing a GaN underlayer dissimilarly to the prior art shown in FIG. 25. In this case, the total thickness can be reduced as compared with the prior art shown in FIG. 25, due to the absence of the GaN underlayer. The InGaN layer 43 is an example of the "nitride-based semiconductor layer" according to the present invention.

The structure of a semiconductor laser device fabricated with the method of forming a nitride-based semiconductor according to the fourth embodiment is now described with reference to FIG. 11. In the semiconductor laser device according to the fourth embodiment, a first conductivity type contact layer 115, a first conductivity type cladding layer 116, an MQW emission layer 117, a second conductivity type cladding layer 118 and a second conductivity type contact layer 119 are formed on the InGaN layer 43 shown in FIG. 10. An n-side electrode 120 is formed on the back surface of the n-type SiC substrate 41. A p-side electrode 121 is formed on the upper surface of the second conductivity type contact layer 119. The compositions and the thicknesses of the aforementioned layers 115 to 119 are similar to those of the semiconductor laser device according to the second embodiment shown in FIG. 7.

Figure 10:
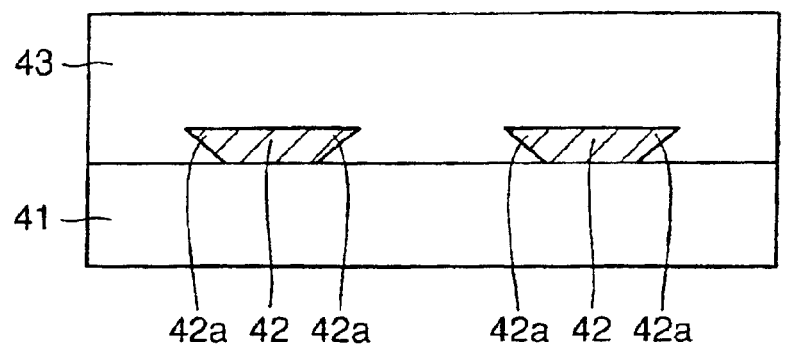
FIG. 10 is a sectional view for illustrating a method of forming a nitride-based semiconductor according to a fourth embodiment of the present invention.
Figure 11:
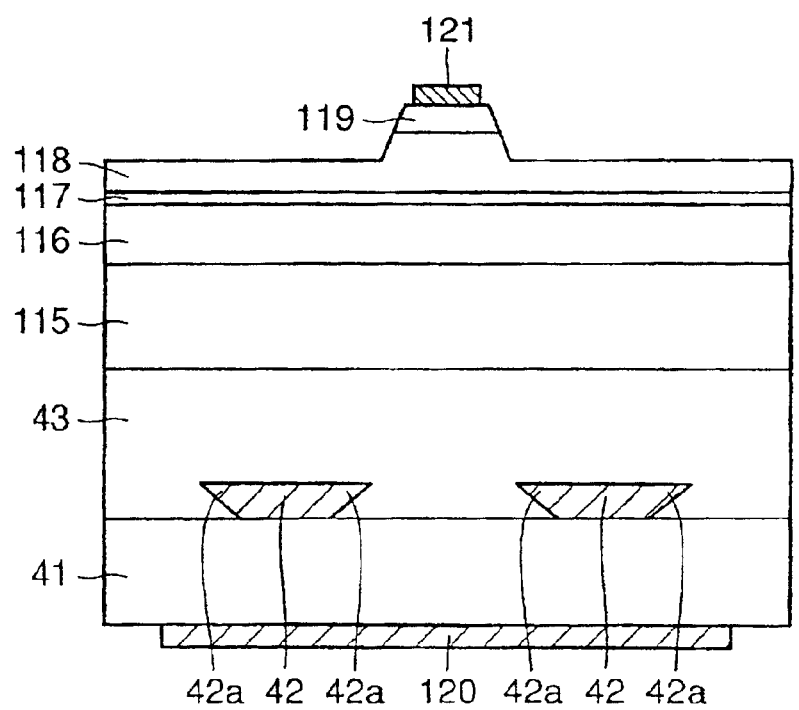
FIG. 11 is a sectional view showing a semiconductor laser device fabricated with the method of forming a nitride-based semiconductor according to the fourth embodiment shown in FIG. 10.

In the semiconductor laser device according to the fourth embodiment, the layers 115 to 119 are formed on the InGaN layer 43 having low dislocation density formed by the method shown in FIG. 10, whereby excellent crystallinity can be implemented in the layers 115 to 119. In the method of forming a nitride-based semiconductor shown in FIG. 10, the total thickness is reduced, whereby the semiconductor laser device fabricated by forming the layers 115 to 119 on the InGaN layer 43 is reduced in thickness. Thus, a semiconductor laser device having a small thickness and excellent device characteristics can be obtained according to the fourth embodiment, similarly to the second embodiment.

(Fifth Embodiment)

A method of forming a nitride-based semiconductor according to a fifth embodiment of the present invention is described with reference to FIG. 12.

According to the fifth embodiment, mask layers 52 consisting of SiN are formed on the surface of an n-type GaAs substrate 51 serving as an underlayer in a thickness of about 10 nm to about 1000 nm and a cycle of 5 $\mu$m. The mask layers 52 are employed as masks for etching the n-type GaAs substrate 51. In this case, over-etching is performed for forming inverse mesa (inverse-trapezoidal) projection portions 51a on the n-type GaAs substrate 51. The n-type GaAs substrate 51 is etched with $H_2SO_4+H_2O_2+H_2O$ (4:1:1) or $H_3PO_4+H_2O_2+H_2O$ (3:1:1).

Thereafter low-temperature buffer layers 53 of AlGaN or GaN having a thickness of about 10 nm to about 50 nm are formed on exposed surface portions of the n-type GaAs substrate 51 by MOCVD or HVPE under a temperature condition of about 500° C. to about 700° C.

An n-type GaN layer 54 is epitaxially laterally overgrown on the low-temperature buffer layers 53 through the mask layers 52 serving as selective growth masks by MOCVD or HVPE. In this case, the projection portions 51a located under the mask layers 52 have the inverse mesa shape, whereby both ends of the mask layers 52 have overhangs protruding above the exposed parts of the n-type GaAs substrate 51. In other words, the minimum distance W1 between adjacent mask layers 52 is smaller than the width W2 of the exposed parts of the n-type GaAs substrate 51 located between the adjacent mask layers 52. Small facets similar to those shown in the conceptual diagram of FIG. 1 are formed under the overhangs of the mask layers 52. Thus, lateral growth is so facilitated that the n-type GaN layer 54 having low dislocation density can be formed with a small thickness. The n-type GaN layer 54 is an example of the "nitride-based semiconductor layer" according to the present invention.

Crystal growth of the n-type GaN layer 54 is further facilitated due to the low-temperature buffer layers 53 formed between the n-type GaAs substrate 51 and the n-type GaN layer 54, whereby a larger number of small facets can be formed on the low-temperature buffer layers 53 located under the overhangs. Thus, lateral growth can be more facilitated, whereby the n-type GaN layer 54 having low dislocation density can be grown on the n-type GaAs substrate 51 with a smaller thickness to form hetero structure.

Figure 12:
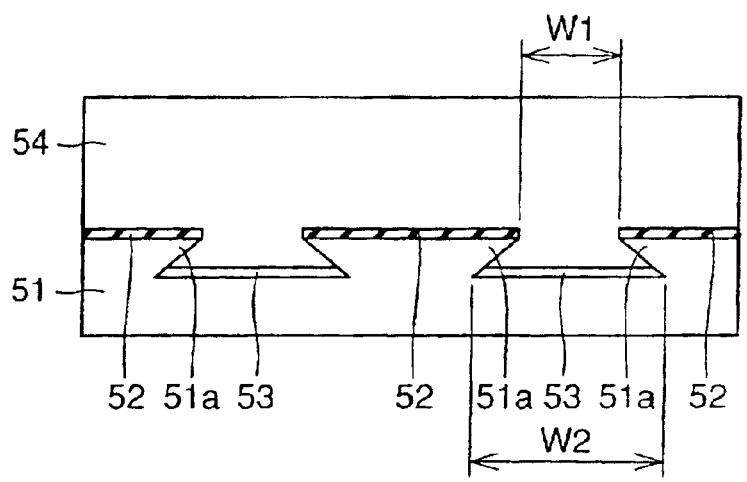
FIG. 12 is a sectional view for illustrating a method of forming a nitride-based semiconductor according to a fifth embodiment of the present invention.
Figure 13:
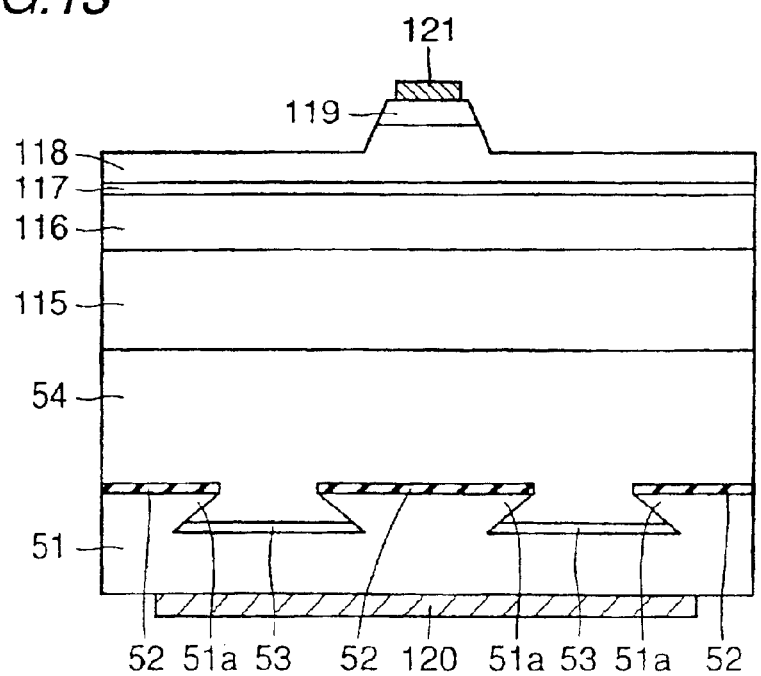
FIG. 13 is a sectional view showing a semiconductor laser device fabricated with the method of forming a nitride-based semiconductor according to the fifth embodiment shown in FIG. 12.

A semiconductor laser device fabricated with the method of forming a nitride-based semiconductor according to the fifth embodiment shown in FIG. 12 is described with reference to FIG. 13. In the semiconductor laser device according to the fifth embodiment, a first conductivity type contact layer 115, a first conductivity type cladding layer 116, an MQW emission layer 117, a second conductivity type cladding layer 118 and a second conductivity type contact layer 119 are formed on the n-type GaN layer 54 shown in FIG. 12. An n-side electrode 120 is formed on the back surface of the n-type GaAs substrate 51. A p-side electrode 121 is formed on the upper surface of the second conductivity type contact layer 119. The compositions and the thicknesses of the aforementioned layers 115 to 119 are similar to those of the semiconductor laser device according to the second embodiment shown in FIG. 7.

In the semiconductor laser device according to the fifth embodiment, the layers 115 to 119 are formed on the n-type GaN layer 54 having low dislocation density and a small thickness formed by the method shown in FIG. 12, whereby excellent crystallinity can be implemented in the layers 115 to 119. Thus, a semiconductor laser device having a small thickness and excellent device characteristics can be obtained according to the fifth embodiment, similarly to the second and fourth embodiments.

(Sixth Embodiment)

Figure 14:
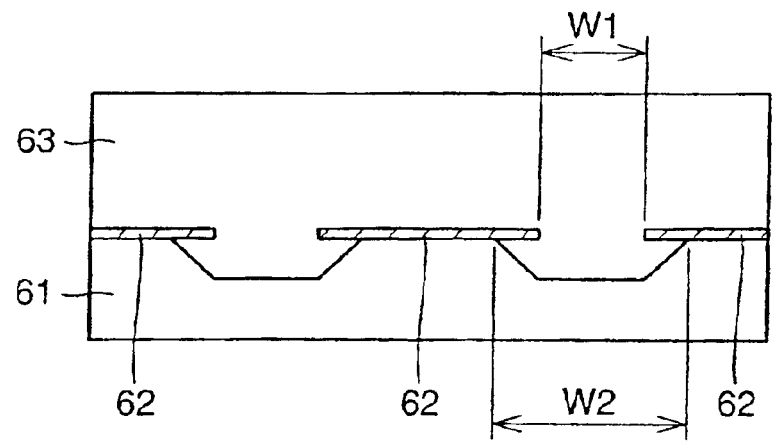
FIG. 14 is a sectional view for illustrating a method of forming a nitride-based semiconductor according to a sixth embodiment of the present invention.

A method of forming a nitride-based semiconductor according to a sixth embodiment of the present invention is described with reference to FIG. 14. According to the sixth embodiment, a tungsten (W) layer is formed on the surface of an n-type Si substrate 61 serving as an underlayer with a thickness of about 10 nm to about 1000 nm and thereafter patterned by photolithography, thereby forming striped mask layers 62 of W in a cycle of about 10 μm. The mask layers 62 are employed as masks for etching the n-type Si substrate 61 with HF, $HNO_3$ and $CH_3COOH$ (1:5:1) thereby scooping regions of the n-type Si substrate 61 located under both ends of the mask layers 62, as shown in FIG. 14. In other words, both ends of the mask layers 62 present overhangs protruding above ends of exposed parts of the n-type Si substrate 61. The minimum distance W1 between adjacent mask layers 62 is smaller then the width W2 of the exposed parts of the n-type Si substrate 61 located between the adjacent mask layers 62.

The mask layers 62 are employed as selective growth masks for epitaxially laterally overgrowing an n-type GaN layer 63 on the n-type Si substrate 61 by MOCVD or HVPE. In this case, small facets similar to those shown in the conceptual diagram of FIG. 1 are formed on surface portions of the n-type Si substrate 61 located under the overhangs on both ends of the mask layers 62. Thus, lateral growth is facilitated from an initial stage of growth, so that the n-type GaN layer 63 having low dislocation density can be grown on the n-type Si substrate 61 with a small thickness to form hetero structure. The n-type GaN layer 63 is an example of the "nitride-based semiconductor layer" according to the present invention.

Figure 15:
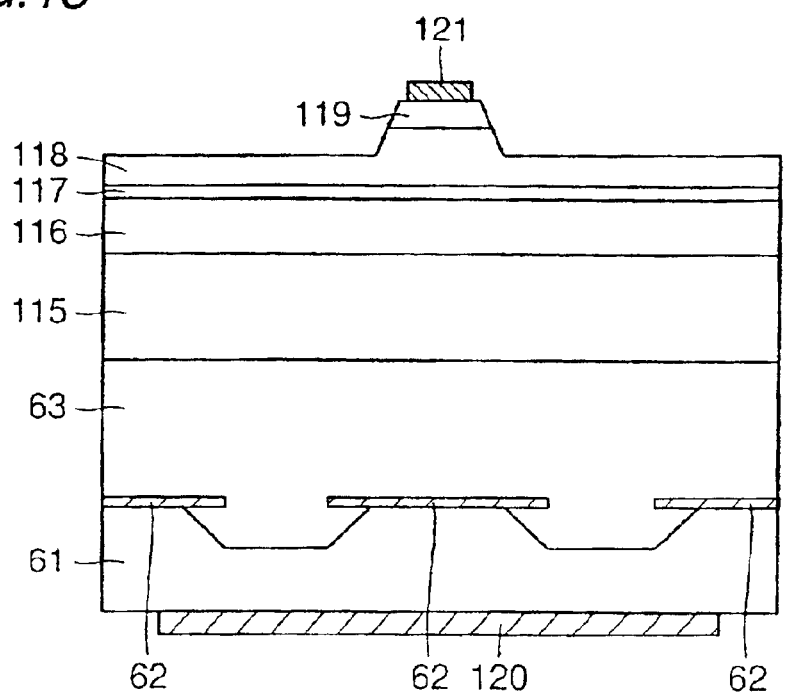
FIG. 15 is a sectional view showing a semiconductor laser device fabricated with the method of forming a nitride-based semiconductor according to the sixth embodiment shown in FIG. 14.

The structure of a semiconductor laser device fabricated with the method of forming a nitride-based semiconductor according to the sixth embodiment shown in FIG. 14 is described with reference to FIG. 15. In the semiconductor laser device according to the sixth embodiment, a first conductivity type contact layer 115, a first conductivity type cladding layer 116, an MQW emission layer 117, a second conductivity type cladding layer 118 and a second conductivity type contact layer 119 are formed on the n-type GaN layer 63 shown in FIG. 14. An n-side electrode 120 is formed on the back surface of the n-type Si substrate 61. A p-side electrode 121 is formed on the upper surface of the second conductivity type contact layer 119. The compositions and the thicknesses of the aforementioned layers 115 to 119 are similar to those of the semiconductor laser device according to the second embodiment shown in FIG. 7.

In the semiconductor laser device according to the sixth embodiment, the layers 115 to 119 are formed on the n-type GaN layer 63 having low dislocation density and a small thickness formed by the method shown in FIG. 14, whereby excellent crystallinity can be implemented in the layers 115 to 119. Thus, a semiconductor laser device having a small thickness and excellent device characteristics can be obtained according to the sixth embodiment, similarly to the second, fourth and fifth embodiments.

While the sapphire substrate, the Si substrate, the SiC substrate or the GaAs substrate is employed in each of the aforementioned first to sixth embodiments, a spinel substrate, a GaP substrate, an InP substrate, a crystal substrate, a ZnO substrate or a $ZrB_2$ substrate may alternatively be employed. A remarkable effect of reducing the number of dislocations can be attained in particular when such a substrate other than a nitride-based semiconductor substrate is employed.

(Seventh Embodiment)

Figure 16:
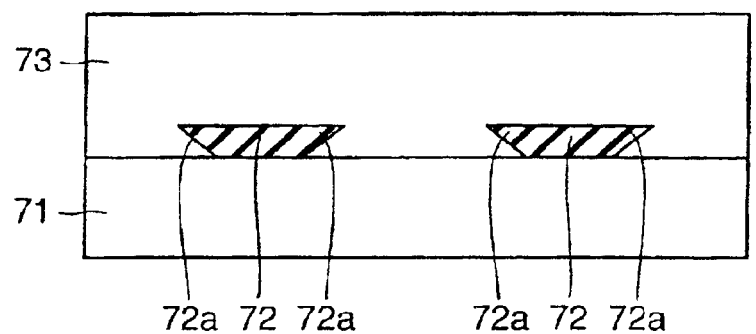
FIG. 16 is a sectional view for illustrating a method of forming a nitride-based semiconductor according to a seventh embodiment of the present invention.

A method of forming a nitride-based semiconductor according to a seventh embodiment of the present invention is described with reference to FIG. 16. According to the seventh embodiment, inverse mesa mask layers 72 of SiN having overhangs 72a are formed on an n-type GaN substrate 71 serving as an underlayer. The mask layers 72 of SiN have a thickness of about 10 nm to about 1000 nm, and are formed in the shape of stripes in a cycle of about 10 μm. In order to form the mask layers 72, an SiN layer (not shown) is formed on the overall upper surface of the n-type GaN substrate 71, followed by formation of resist films (not shown) on prescribed regions of the SiN layer. The resist films are employed as masks for over-etching the SiN layer. Thus, the inverse mesa mask layers 72 having the overhangs 72a are formed. The minimum distance between adjacent mask layers 72 is smaller than the width of an exposed part of the n-type GaN substrate 71 located between the adjacent mask layers 72.

Thereafter the mask layers 72 are employed as selective growth masks for epitaxially laterally overgrowing an n-type BGaN layer 73 on the n-type GaN substrate 71 by MOCVD or HVPE. The BGaN layer 73 is formed to have a thickness of about 2 μm under a temperature condition of about 850° C. to about 1400° C. In this case, small facets similar to those shown in the conceptual diagram of FIG. 1 are formed under the overhangs 72a of the mask layers 72. Thus, lateral growth is facilitated so that the BGaN layer 73 having low dislocation density can be thickly formed on the n-type GaN substrate 71 with no requirement for a GaN underlayer. In this case, the total thickness can be reduced as compared with the prior art shown in FIG. 25 due to absence of the GaN underlayer. The BGaN layer 73 is an example of the "nitride-based semiconductor layer" according to the present invention.

Figure 17:
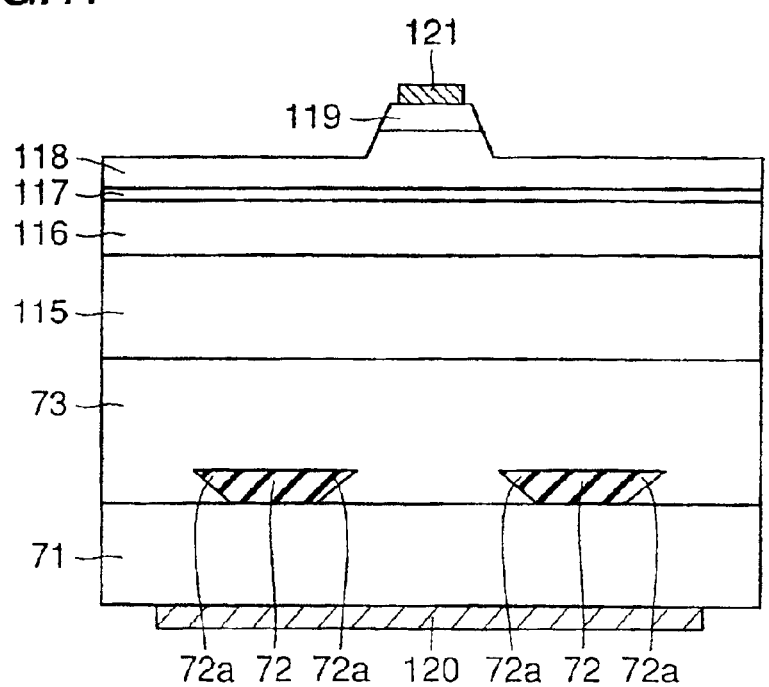
FIG. 17 is a sectional view showing a semiconductor laser device fabricated with the method of forming a nitride-based semiconductor according to the seventh embodiment shown in FIG. 16.

The structure of a semiconductor laser device fabricated with the method of forming a nitride-based semiconductor according to the seventh embodiment is described with reference to FIG. 17. In this semiconductor laser device, a first conductivity type contact layer 115, a first conductivity type cladding layer 116, an MQW emission layer 117, a second conductivity type cladding layer 118 and a second conductivity type contact layer 119 are formed on the n-type BGaN layer 73 shown in FIG. 16. An n-side electrode 120 is formed on the back surface of the n-type GaN substrate 71. A p-side electrode 121 is formed on the upper surface of the second conductivity type contact layer 119. The compositions and the thicknesses of the aforementioned layers 115 to 119 are similar to those of the semiconductor laser device according to the second embodiment shown in FIG. 7.

In the semiconductor laser device according to the seventh embodiment, the layers 115 to 119 are formed on the BGaN layer 73 having low dislocation density, whereby excellent crystallinity can be implemented in the layers 115 to 119. According to the method shown in FIG. 16, the total thickness is reduced and hence the thickness of the semiconductor laser device is reduced when the layers 115 to 119 are formed on the BGaN layer 73. Thus, a semiconductor laser device having a small thickness and excellent device characteristics can be obtained according to the seventh embodiment, similarly to the second, fourth, fifth and sixth embodiments.

While the BGaN layer 73 is formed as the nitride-based semiconductor layer in the aforementioned seventh embodiment, the nitride-based semiconductor layer is not restricted to the BGaN layer 73 in this embodiment. For example, a mixed crystal of a nitride-based semiconductor such as InN, GaInN, AlGaN, AlGaInN or AlN or a mixed crystal of a nitride-based semiconductor containing at least one of B, In and Tl may alternatively be employed.

While the GaN substrate 71 is employed in the aforementioned seventh embodiment, a sapphire substrate, an Si substrate, an SiC substrate, a GaAs substrate, a spinel substrate, a GaP substrate, an InP substrate, a crystal substrate, a ZnO substrate or a $ZrB_2$ substrate may alternatively be employed in place of the GaN substrate 71.

(Eighth Embodiment)

A method of forming a nitride-based semiconductor according to an eighth embodiment of the present invention is described with reference to FIG. 18. According to the eighth embodiment, a low-temperature buffer layer 82 of AlGaN or GaN having a thickness of about 10 nm to about 50 nm is formed on a sapphire substrate 81 by MOCVD or HVPE under a temperature condition of about 500° C. to about 700° C. A GaN layer 83 serving as an underlayer is formed on the low-temperature buffer layer 82 with a thickness of about 2 μm by MOCVD or HVPE. Inverse mesa mask layers 84 of SiN having overhangs 84a are formed on the GaN layer 83. The minimum distance between adjacent mask layers 84 is smaller than the width of an exposed part of the GaN layer 83 located between the adjacent mask layers 84.

The mask layers 84 are employed as masks for epitaxially laterally overgrowing an AlInGaN layer 84 on the GaN layer 83 by MOCVD or HVPE. The AlInGaN layer 85 is formed to have a thickness of about 1 μm under a temperature condition of about 600° C. to about 1200° C.

In this case, small facets are formed under the overhangs 84a of the mask layers 84. Thus, lateral growth is facilitated so that the AlInGaN layer 85 having low dislocation density can be formed with a small thickness. The AlInGaN layer 85 is an example of the "nitride-based semiconductor layer" according to the present invention.

Figure 18:
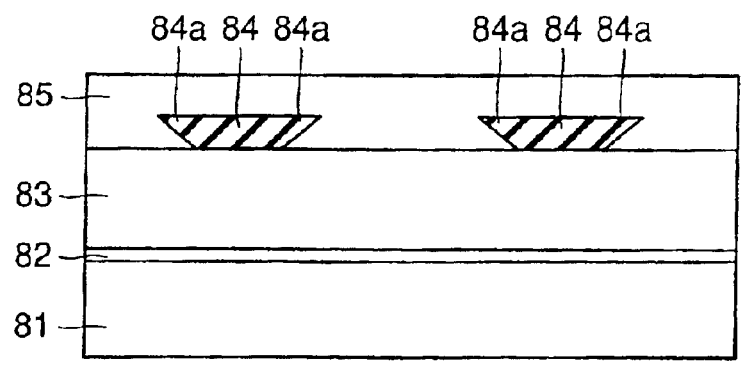
FIG. 18 is a sectional view for illustrating a method of forming a nitride-based semiconductor according to an eighth embodiment of the present invention.
Figure 19:
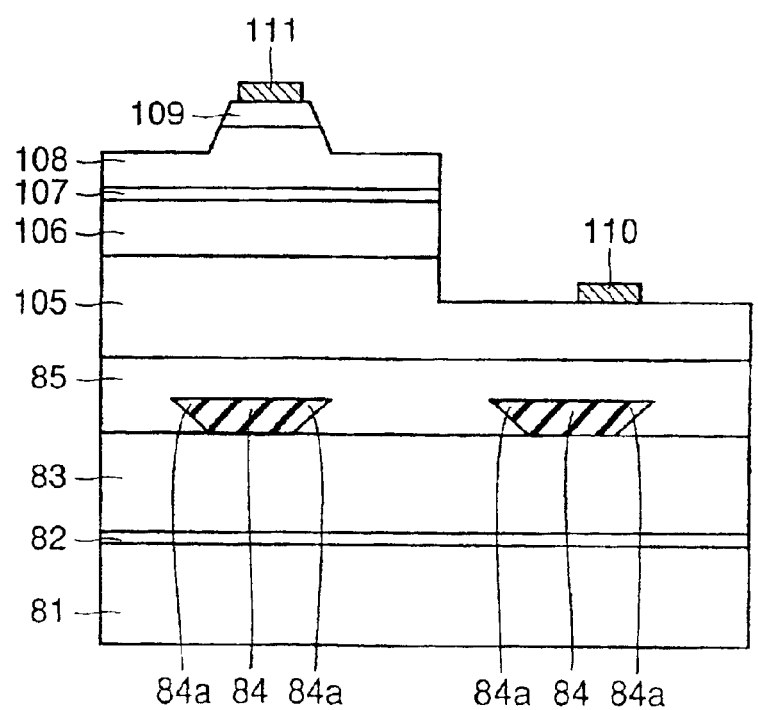
FIG. 19 is a sectional view showing a semiconductor laser device fabricated with the method of forming a nitride-based semiconductor according to the eighth embodiment shown in FIG. 18.
Figure 20:
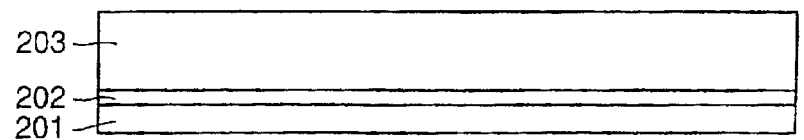
FIGS. 20 to 23 are sectional views for illustrating an exemplary conventional method of forming a nitride-based semiconductor employing epitaxial lateral overgrowth.
Figure 21:
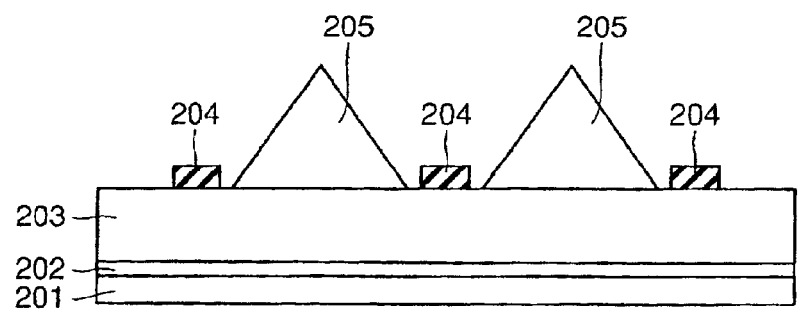
Figure 22:
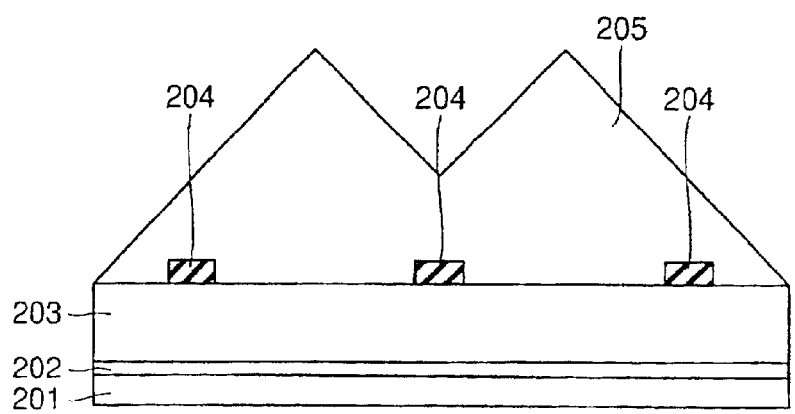
Figure 23:
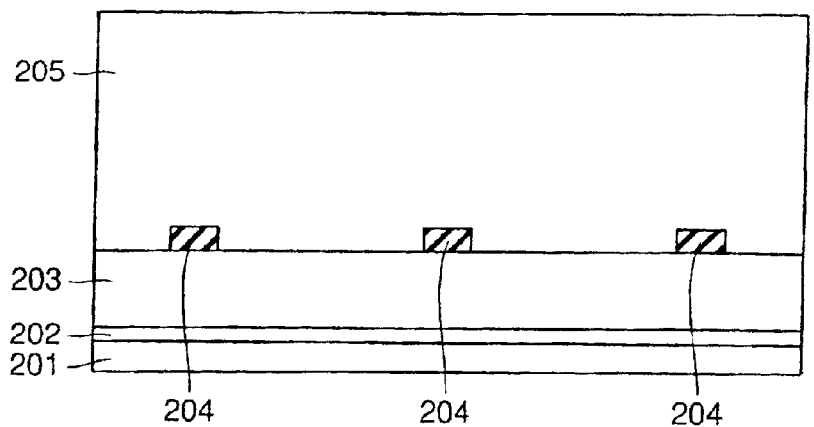
Figure 24:
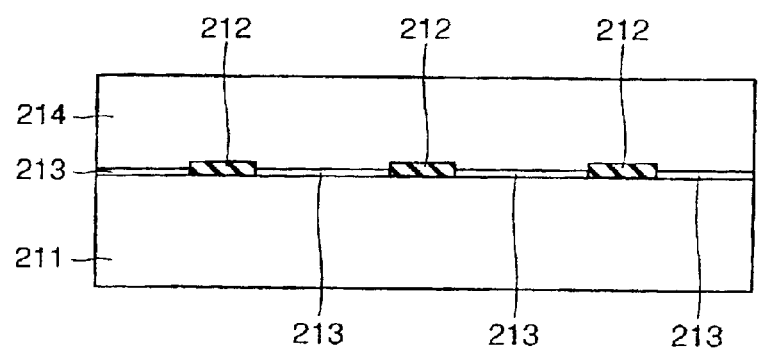
FIG. 24 is a sectional view for illustrating a conventional method of directly forming a nitride-based semiconductor on a substrate by epitaxial lateral overgrowth.

The structure of a semiconductor laser device fabricated with the method of forming a nitride-based semiconductor shown in FIG. 18 is described with reference to FIG. 19. In the semiconductor laser device according to the eighth embodiment, a first conductivity type contact layer 105, a first conductivity type cladding layer 106, an MQW emission layer 107, a second conductivity type cladding layer 108, a second conductivity type contact layer 109, an n-side electrode 110 and a p-side electrode 111 are formed on the AlInGaN layer 85 shown in FIG. 18. The compositions and the thicknesses of the aforementioned layers 105 to 109 are similar to those of the semiconductor laser device according to the first embodiment shown in FIG. 5.

According to the eighth embodiment, the layers 105 to 109 are formed on the AlInGaN layer 85 having low dislocation density formed with a small thickness, whereby excellent crystallinity can be implemented in the layers 105 to 109. Consequently, a semiconductor laser device having a small thickness and excellent device characteristics can be obtained according to the eighth embodiment.

Although the present invention has been described and illustrated in detail, it is clearly understood that the same is by way of illustration and example only and is not to be taken by way of limitation, the spirit and scope of the present invention being limited only by the terms of the appended claims.

While mask layers having various overhanging shapes are shown in the aforementioned embodiments, for example, the present invention is not restricted to this but the mask layers may have a structure other than those in the aforementioned embodiments so far as the distance between adjacent mask layers is smaller than the width of exposed parts of the underlayer located between the adjacent mask layers.

While the striped mask layers are formed in the aforementioned first to eighth embodiments, the present invention is not restricted to this but the mask layers may alternatively have a hexagonal shape, a triangular shape, hexagonal openings or triangular openings, for example.

What is claimed is:

1. A nitride-based semiconductor element comprising:

a plurality of mask layers formed at a prescribed interval to come into contact with the upper surface of an underlayer while partially exposing said underlayer; and a nitride-based semiconductor layer, formed on the upper surface of said underlayer and said mask layers, consisting of a material different from that of said underlayer, wherein
  the minimum distance between adjacent said mask layers is smaller than the width of an exposed part of said underlayer located between said adjacent mask layers.

2. The nitride-based semiconductor element according to claim 1, wherein
said underlayer includes a substrate, and
said mask layers are formed to be in contact with the upper surface of said substrate.

3. The nitride-based semiconductor element according to claim 1, wherein facets of the nitride-based semiconductor layer were formed on an exposed part of the upper surface of said underlayer located between said adjacent mask layers, having at least two types of different sizes.

4. The nitride-based semiconductor element according to claim 1, wherein
said nitride-bayed semiconductor layer is formed on the upper surface of said underlayer through a buffer layer.

5. The nitride-based semiconductor element according to claim 1, wherein
said nitride-based semiconductor layer is formed to be in contact with the upper surface of said underlayer.

6. The nitride-based semiconductor element according to claim 1, wherein
said mask layers have overhangs protruding above an exposed part of said underlayer.

7. The nitride-based semiconductor element according to claim 6, wherein
said mask layers are at least partially inverse-trapezoidal.

8. The nitride-based semiconductor element according to claim 1, wherein
said underlayer includes projection portions,
said projection portions are inverse-trapezoidal convex portions, and
said mask layers are formed to be in contact with the upper surfaces of said inverse-trapezoidal convex portions.

9. The nitride-based semiconductor element according to claim 1, wherein
said underlayer includes projection portions, and
said mask layers are formed to be in contact with the upper surfaces of said projection portions so that side portions of said mask layers protrude from said projection portions.

10. The nitride-based semiconductor element according to claim 1, wherein
said mask layers include:
a first mask layer formed to be in contact with the upper surface of said underlayer, and
a second mask layer, formed on said first mask layer, consisting of a material harder to etch than said first mask layer.

11. The nitride-based semiconductor element according to claim 1, further comprising a nitride-based semiconductor element layer, formed on said nitride-based semiconductor layer, having an element region.

12. A method of forming a nitride-based semiconductor comprising steps of:
forming a plurality of mask layers at a prescribed interval to be in contact with the upper surface of an underlayer while partially exposing said underlayer; and
growing a nitride-based semiconductor layer consisting of a material different from that of said underlayer on the upper surface of said underlayer and said mask layers, wherein
the minimum distance between adjacent said mask layers is smaller than the width of an exposed part of said underlayer located between said adjacent mask layers.

13. The method of forming a nitride-based semiconductor according to claim 12, wherein
said step of growing said nitride-based semiconductor layer includes a step of growing said nitride-based semiconductor layer on the upper surface of said underlayer through a buffer layer.

14. The method of forming a nitride-based semiconductor according to claim 12, wherein
said step of growing said nitride-based semiconductor layer includes a step of growing said nitride-based semiconductor layer to be in contact with the upper surface of said underlayer.

15. The method of forming a nitride-based semiconductor according to claim 12, wherein
said mask layers have overhangs protruding above an exposed part of said underlayer.

16. The method of forming a nitride-based semiconductor according to claim 15, wherein
said mask layers are at least partially inverse-trapezoidal.

17. The method of forming a nitride-based semiconductor according to claim 12, wherein
said underlayer includes a substrate, and
said mask layers are formed to be in contact with the upper surface of said substrate.

18. The method of forming a nitride-based semiconductor according to claim 12, wherein
said underlayer includes projection portions,
said projection portions are inverse-trapezoidal, and
said mask layers are formed to be in contact with the upper surfaces of said inverse-trapezoidal projection portions.

19. The method of forming a nitride-based semiconductor according to claim 12, wherein
said underlayer includes projection portions, and
said mask layers are formed to be in contact with the upper surfaces of said projection portions so that side portions of said mask layers protrude from said projection portions.

20. The method of forming a nitride-based semiconductor according to claim 12, wherein
said step of forming said mask layers includes steps of:
forming a first mask layer to be in contact with the upper surface of said underlayer,
forming a second mask layer consisting of a material harder to etch than said first mask layer on said first mask layer, and
forming an etching mask on a prescribed region of said second mask layer and thereafter etching said second mask layer and said first mask layer through said etching mask serving as a mask thereby forming overhanging mask layers.

21. The method of forming a nitride-based semiconductor according to claim 12, further comprising a step of growing a nitride-based semiconductor element layer having an element region on said nitride-based semiconductor layer.

22. A method of forming a nitride-based semiconductor comprising steps of:
forming a plurality of mask layers at a prescribed interval to be in contact with the upper surface of an underlayer while partially exposing said underlayer; and
growing a nitride-based semiconductor layer consisting of a material different from that of said underlayer on an exposed part of the upper surface of said underlayer located between adjacent said mask layers to have difference in growth rate.

23. The method of forming a nitride-based semiconductor according to claim 22, wherein
said step of growing said nitride-based semiconductor layer includes a step of growing facets having at least two types of different sizes on said exposed part of the upper surface of said underlayer located between said adjacent mask layers thereby growing said nitride-based semiconductor layer.

* * * * *